United States Patent
Shin et al.

(10) Patent No.: US 9,142,796 B2
(45) Date of Patent: Sep. 22, 2015

(54) ORGANIC LIGHT EMITTING DIODE DISPLAY DEVICE

(71) Applicant: LG Display., Ltd., Seoul (KR)

(72) Inventors: Hong-Dae Shin, Gyeonggi-do (KR); Myung-Seop Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/132,234

(22) Filed: Dec. 18, 2013

(65) Prior Publication Data
US 2014/0183491 A1 Jul. 3, 2014

(30) Foreign Application Priority Data
Dec. 31, 2012 (KR) .......................... 10-2012-0158143

(51) Int. Cl.
*H01L 51/52* (2006.01)
*H01L 27/32* (2006.01)

(52) U.S. Cl.
CPC .......... *H01L 51/524* (2013.01); *H01L 27/3276* (2013.01)

(58) Field of Classification Search
CPC .............. H01L 27/3276; H01L 27/524; H01L 51/5237
See application file for complete search history.

(56) References Cited

U.S. PATENT DOCUMENTS

| | | | |
|---|---|---|---|
| 7,049,741 B2* | 5/2006 | Madathil et al. | 313/504 |
| 2007/0278952 A1* | 12/2007 | Sung et al. | 313/512 |
| 2010/0142178 A1* | 6/2010 | Yee et al. | 361/829 |
| 2011/0315977 A1* | 12/2011 | Murayama et al. | 257/40 |
| 2012/0062481 A1* | 3/2012 | Kim et al. | 345/173 |

* cited by examiner

*Primary Examiner* — Yu-Hsi D Sun
*Assistant Examiner* — Wasiul Haider
(74) *Attorney, Agent, or Firm* — Morgan, Lewis & Bockius LLP

(57) ABSTRACT

Disclosed is an organic light emitting diode display device in which at least one lateral surface of an encapsulation substrate is inclined to prevent disconnection of a film connected to a pad, thereby achieving a narrow bezel and enhanced reliability. The display device includes a substrate, an organic light emitting diode array including a thin film transistor arranged on the substrate and an organic light emitting diode connected to the thin film transistor, a pad disposed on the substrate and configured to receive a drive signal to drive the organic light emitting diode array, an encapsulation substrate bonded to the substrate to face each other so as to cover the organic light emitting diode array, and a film connected to the pad and provided with a drive chip thereon. At least one lateral surface of the encapsulation substrate is inclined.

7 Claims, 6 Drawing Sheets

ORGANIC LIGHT EMITTING DIODE DISPLAY DEVICE

This application claims the benefit of Korean Patent Application No. 10-2012-0158143, filed on Dec. 31, 2012, which is hereby incorporated by reference as if fully set forth herein.

BACKGROUND OF THE INVENTION

1. Field of the Invention

The present invention relates to an organic light emitting diode display device, and more particularly to an organic light emitting diode display device which may achieve a narrow bezel and enhance reliability.

2. Discussion of the Related Art

Image display devices to display various information on a screen are core technologies of the information age and are being developed to achieve thinner, lighter and higher performance portable designs. Organic light emitting diode display devices to display an image via control of light emission of an emission layer are getting the spotlight as flat panel display devices that may reduce disadvantageous weight and volume of a Cathode Ray Tube (CRT).

Such organic light emitting diode display devices include Organic Light Emitting Diodes (OLEDs) that are self-luminous using a thin emission layer between electrodes. A typical organic light emitting diode includes a first electrode that is an anode connected to a thin film transistor formed in each sub-pixel area, an Emission Layer (EML), and a second electrode that is a cathode.

The above-described organic light emitting diode forms excitons via recombination of holes and electrons in the emission layer when voltage is applied to the first and second electrodes, and light is emitted as the excitons return to the grounded state. A protective film is disposed on the organic light emitting diode to cover the organic light emitting diode and serves to prevent invasion of moisture and oxygen to the organic light emitting diode.

The organic light emitting diode is easily deteriorated by external factors, such as moisture, oxygen, ultraviolet light, device fabrication conditions, and the like. Therefore, in a typical organic light emitting diode display device, a substrate provided with organic light emitting diodes is bonded to an encapsulation substrate via an adhesive layer.

FIGS. 1A and 1B are sectional views of a typical organic light emitting diode display device which is of a bottom emission type. FIG. 2 is a photograph of an edge of a typical encapsulation substrate.

As exemplarily shown in FIG. 1A, a typical organic light emitting diode display device includes a substrate, an organic light emitting diode array 10 that includes thin film transistors arranged on the substrate and organic light emitting diodes connected to the thin film transistors, an encapsulation substrate 20 configured to cover the organic light emitting diode array 10, and a polarizer 40 attached to a bottom surface of the organic light emitting diode array 10. In addition, a border 50 is provided to surround edges of the organic light emitting diode array 10, the encapsulation substrate 20, and the polarizer 40.

In particular, in the case of an organic light emitting diode display device having a Chip On Film (COF) structure, a film 30a on which a drive chip 30b to drive the organic light emitting diode array 10 is mounted is connected to a pad 10a of the organic light emitting diode array 10. To enhance adhesion between the pad 10a and the film 30a, however, the film 30a needs be folded once. Accordingly, in this case, a sufficient distance D between the border 50 and the organic light emitting diode array 10 is needed, which makes it impossible to achieve a narrow bezel.

As exemplarily shown in FIG. 1B, such a narrow bezel may be achieved if the film 30a is configured to directly extend to the encapsulation substrate 20. However, cracks or disconnection of the film 30a may occur due to an edge of the encapsulation substrate 20 as exemplarily shown in FIG. 2. In addition, although providing the film 30a with a buffer may prevent damage to the film 30a, this may increase a thickness of the film 30a. Therefore, it is necessary to consider a width of the pad 10a and a design margin between the pad 10a and the encapsulation substrate 20.

SUMMARY OF THE INVENTION

Accordingly, the present invention is directed to an organic light emitting diode display device that substantially obviates one or more problems due to limitations and disadvantages of the related art.

An object of the present invention is to provide an organic light emitting diode display device in which at least one lateral surface of an encapsulation substrate is inclined to prevent disconnection of a film from a pad, thereby achieving enhanced reliability and a narrow bezel.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the present invention, as embodied and broadly described herein, an organic light emitting diode display device includes a substrate, an organic light emitting diode array including a thin film transistor arranged on the substrate and an organic light emitting diode connected to the thin film transistor, a pad disposed on the substrate and configured to receive a drive signal to drive the organic light emitting diode array, an encapsulation substrate bonded to the substrate to face each other so as to cover the organic light emitting diode array, and a film connected to the pad and provided with a drive chip thereon, wherein at least one lateral surface of the encapsulation substrate is inclined.

Light emitted from the organic light emitting diode may be discharged outward through the substrate.

The film may be extended along the inclined lateral surface of the encapsulation substrate and a rear surface (a top surface) of the encapsulation substrate.

A recess may be formed between the inclined lateral surface of the encapsulation substrate and a top surface of the encapsulation substrate.

The drive chip may be seated in the recess.

The encapsulation substrate may have a thickness within a range of 50 μm to 200 μm.

The encapsulation substrate may be formed of metal.

A first angle between a lower bottom of the encapsulation substrate coming into contact with the organic light emitting diode array and the lateral surface of the encapsulation substrate may be greater than 0° and less than 90°, and a second angle between the lateral surface of the encapsulation substrate and a top surface of the encapsulation substrate may be greater than 90° and less than 180°.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the present invention and are incorporated in and constitute a part of this application, illustrate embodiment(s) of the invention and together with the description serve to explain the principle of the invention. In the drawings.

DETAILED DESCRIPTION OF THE INVENTION

Hereinafter, an organic light emitting diode display device according to the present invention will be described in detail with reference to the accompanying drawings.

First Embodiment

Figure 1A:
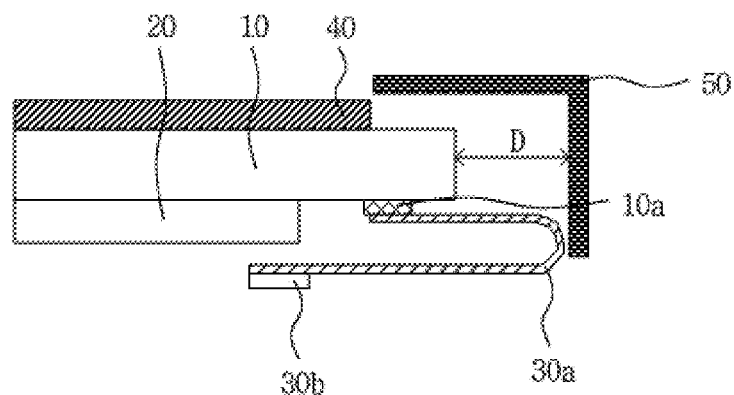
FIGS. 1A and 1B are sectional views of a typical organic light emitting diode display device.
Figure 1B:
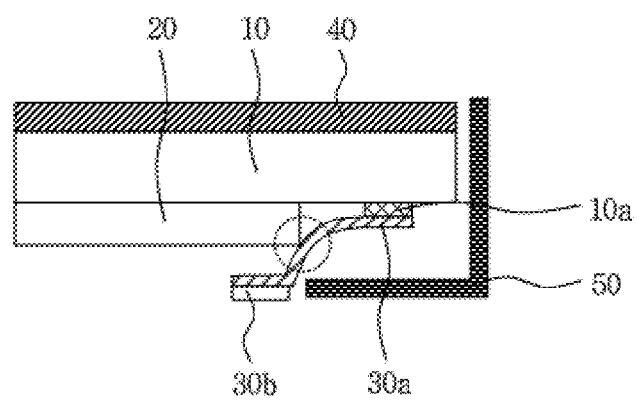
Figure 2:
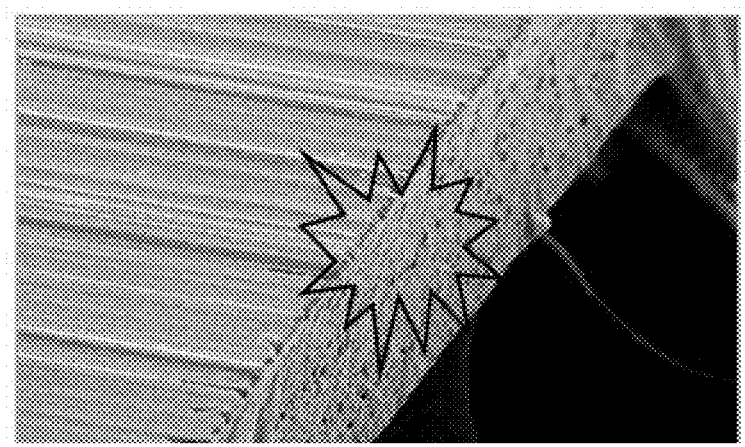
FIG. 2 is a photograph of an edge of a typical encapsulation substrate.
Figure 3:
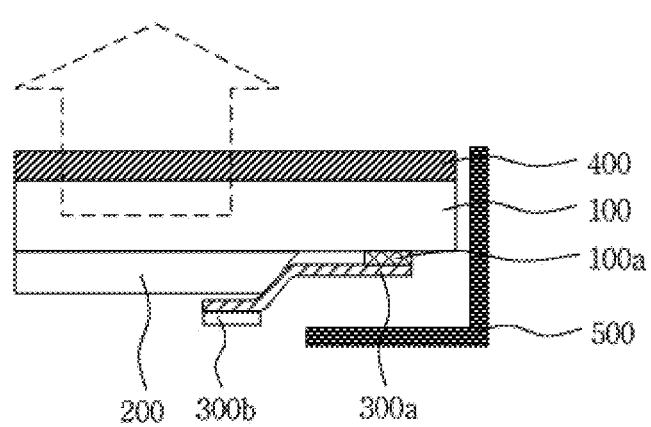
FIG. 3 is a sectional view of an organic light emitting diode display device according to a first embodiment of the present invention.
Figure 4:
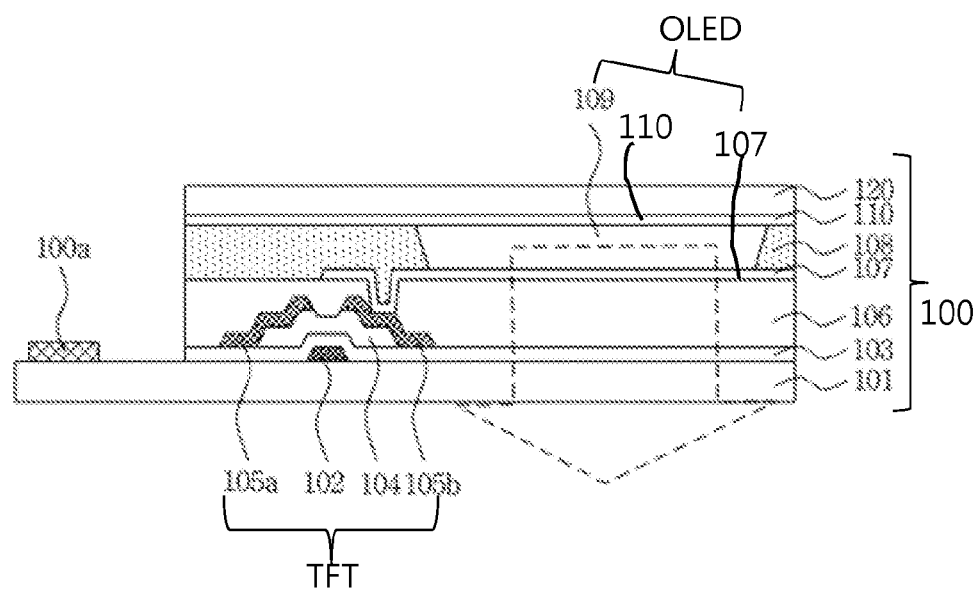
FIG. 4 is an enlarged view of an organic light emitting diode array of FIG. 3.

FIG. 3 is a sectional view of an organic light emitting diode display device according to a first embodiment of the present invention, and FIG. 4 is an enlarged view of an organic light emitting diode array of FIG. 3.

As exemplarily shown in FIG. 3, the organic light emitting diode display device of the present invention includes an array-substrate 100 having an organic light emitting diode array (see 'TFT, OLED' in FIG. 4) that includes thin film transistors (see 'TFT' in FIG. 4) arranged on the substrate and organic light emitting diodes (see 'OLED' in FIG. 4) connected to the thin film transistors TFT, an encapsulation substrate 200 configured to cover the organic light emitting diode array TFT, OLED, and a polarizer 400 attached to a bottom surface of the array substrate 100. In addition, a border 500 configured to surround edges of the array substrate 100, the encapsulation substrate 200, and the polarizer 400 is provided to surround the organic light emitting diode display device. In a process to manufacture the device of FIG. 3, the TFT and OLED are formed on the surface having a pad 101a. The structure of the array substrate 100 of FIG. 3 is inversely shown in FIG. 4 and the terms of 'upper surface' and a 'bottom surface' described hereinafter have positional meaning in view of FIG. 4. For example, the bottom surface of the array substrate 100 means a bottom surface of a substrate 101 in FIG. 4.

As exemplarily shown in FIG. 4, the array substrate 100 includes a substrate 101, thin film transistors TFTs arranged on the substrate 101, and organic light emitting diodes OLED connected to the thin film transistors TFTs. More specifically, sub-pixel areas are defined on the substrate 101 as gate lines and data lines intersect each other with a gate insulating layer 103 interposed therebetween. The thin film transistor provided in each sub-pixel area includes a gate electrode 102, the gate insulating layer 103, a semiconductor layer 104, a source electrode 105a, and a drain electrode 105b.

The above-described thin film transistor TFT is connected to the organic light emitting diode through a contact hole (not shown) that is formed by selectively removing passivation layer 106. The organic light emitting diode OLED includes a first electrode 107, an organic emission layer 109, and a second electrode 110 which are sequentially stacked one above another.

The first electrode 107 is connected to the drain electrode 105b of the thin film transistor through the contact hole (not shown). In this case, the first electrode 107 is formed of a transparent conductive material, such as Tin Oxide (TO), Indium Tin Oxide (ITO), Indium Zinc Oxide (IZO), Indium Tin Zinc Oxide (ITZO), etc., in order to discharge light emitted from the organic emission layer 109 to the outside through the substrate 101.

In addition, a bank insulating layer 108 is disposed on the first electrode 107 to expose a partial region of the first electrode 107. The bank insulating layer 108 separates neighboring organic light emitting diodes from each other, and defines an emission area.

The organic emission layer 109 is formed on the first electrode 107 exposed by the bank insulating layer 108. The organic emission layer 109 may be formed in each sub-pixel area using materials that emit red, green, blue, and white light, or using only a material that emits white light. If the organic emission layer 109 is formed of only a material that emits white light, R, G, and B color filters are provided in each sub-pixel area to enable emission of various colors of light as white light emitted from the organic emission layer 109 passes through the R, G, and B color filters.

The second electrode 110, formed on the organic emission layer 109, is a cathode formed of a reflective metal material, such as aluminum (Al), and serves to reflect light emitted from the organic emission layer 109 to the first electrode 107.

As described above, the organic light emitting diode, including the first electrode 107, the organic emission layer 109, and the second electrode 110 which are sequentially stacked one above another, forms excitons via recombination of holes and electrons in the organic emission layer 109 when voltage is applied to the first and second electrodes 107 and 110, and light is emitted as the excitons return to the grounded state. In addition, a protective film 120 is disposed to cover the organic light emitting diode.

The encapsulation substrate 200 is attached to the protective film 120 via an adhesive layer (not shown) as exemplarily shown in FIG. 3. The encapsulation substrate 200 is formed of glass or metal. A thickness of the encapsulation substrate 200 may be within a range of 50 μm to 200 μm. The adhesive layer (not shown) is formed of acrylic resin or silicon resin, or may be formed of sealant as necessary.

The polarizer 400 is attached to a bottom surface of the substrate (101 in FIG. 4) of the array substrate 100 including the organic light emitting diode array. The border 500 is provided to surround edges of the array substrate 100, the encapsulation substrate 200, and the polarizer 400.

In particular, in the case of the organic light emitting diode display device having a COF structure, a film 300a on which a drive chip 300b to drive the organic light emitting diode array (TFT, OLED) of the array substrate 100 is mounted is connected to a pad 100a formed on the substrate (101 in FIG. 4). In this case, the organic light emitting diode display device of the present invention is of a bottom emission type for emission of light through the substrate 101, and therefore the drive chip 300b mounted on the film 300a connected to the pad 100a is located on a rear surface (a top surface) of the encapsulation substrate 200. In this case, the film 300a has a first surface and a second surface, the pad 100a contacts the first surface of the film 300a and the drive chip 300b is on the second surface of the film 300a. Herein, the film 300a connected to the pad 100a is extended along the inclined lateral surface of the encapsulation substrate 100 and the rear surface of the encapsulation substrate 100 (see FIG. 3).

In this case, the film 300a is disposed along a lateral surface of the encapsulation substrate 200, which may cause cracks of the film 300a due to an edge of the encapsulation substrate 200. Moreover, if the encapsulation substrate 200 is formed of metal, a sharp edge of the encapsulation substrate 200 causes disconnection of the film 300a.

Accordingly, according to the organic light emitting diode display device of the present invention, at least one lateral surface of the encapsulation substrate 200 is inclined to prevent disconnection of the film 300a disposed along the lateral surface of the encapsulation substrate 200. In particular, the inclined lateral surface of the encapsulation substrate 200 has at least one gradient.

In this case, the lateral surface of the encapsulation substrate 200 may be formed via polishing, such as mechanical polishing, chemical polishing, chemical-mechanical polishing, etc., or may be formed using wet etching or dry etching. For example, a photoresist, such as dry film resist (DFR), etc., is formed on the encapsulation substrate 200 to expose the lateral surface of the encapsulation substrate 200, which ensures etching of only the exposed lateral surface of the encapsulation substrate 200.

Figure 5A:
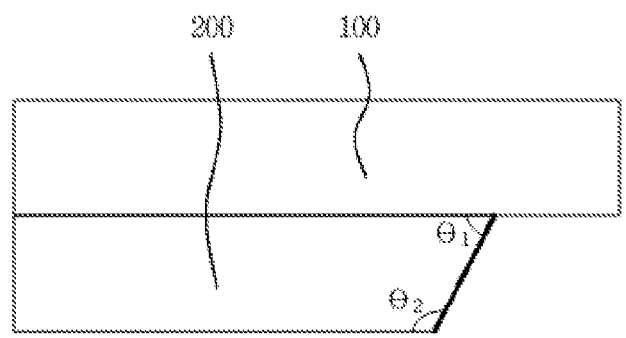
FIGS. 5A to 5C are sectional views showing various embodiments of an encapsulation substrate of FIG. 3.
Figure 5B:
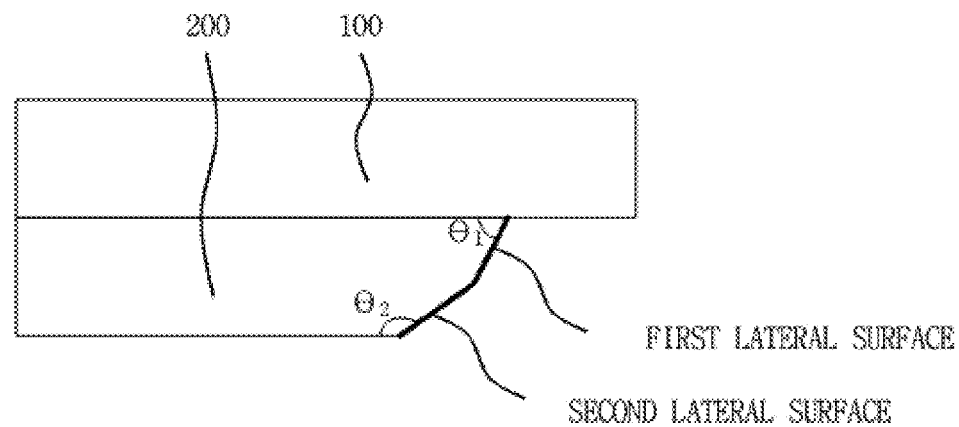
Figure 5C:
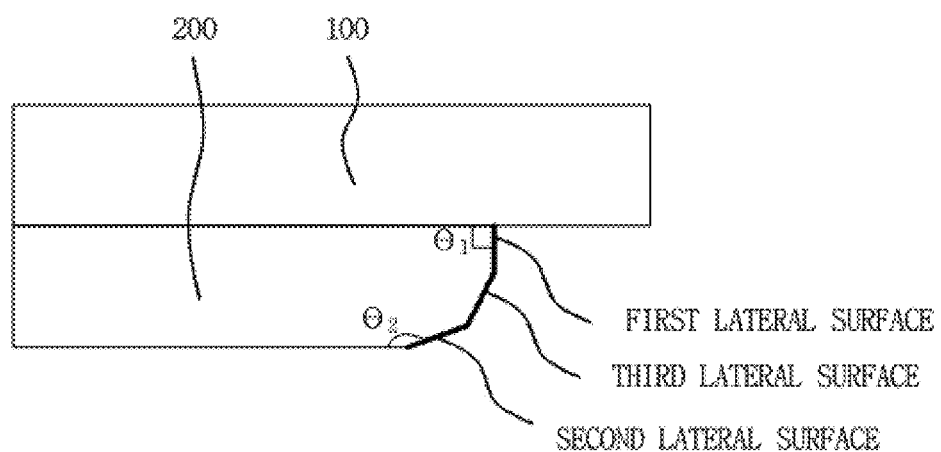

FIGS. 5A to 5C are sectional views showing various embodiments of the encapsulation substrate of FIG. 3.

As exemplarily shown in FIG. 5A, one lateral surface of the encapsulation substrate 200 is inclined by a given gradient. In this case, a first angle $\theta_1$ between a bottom surface (an inner surface) of the encapsulation substrate 200 coming into contact with the organic light emitting diode array 100 and the lateral surface of the encapsulation substrate 200 is greater than 0° and less than 90°, and a second angle $\theta_2$ between the lateral surface of the encapsulation substrate 200 and a top surface of the encapsulation substrate 200 is greater than 90° and less than 180°. In particular, the second angle $\theta_2$ is proportional to the efficiency of prevention of damage to the film 300a.

Additionally, the lateral surface of the encapsulation substrate 200 may be inclined by different two or more gradients. In particular, as the lateral surface of the encapsulation substrate 200 has many more gradients, the encapsulation substrate 200 attains a more gradually inclined lateral surface, which may efficiently prevent damage to the film 300a.

As exemplarily shown in FIG. 5B, in the encapsulation substrate 200 one lateral surface of which has different two gradients, a first angle $\theta_1$ between the bottom surface (inner surface) of the encapsulation substrate 200 coming into contact with the organic light emitting diode array 100 and a first lateral surface of the encapsulation substrate 200 is greater than 0° and less than 90°, and a second angle $\theta_2$ between a second lateral surface of the encapsulation substrate 200 and a top surface of the encapsulation substrate 200 is greater than 90° and less than 180°.

As exemplarily shown in FIG. 5C, if the first angle $\theta_1$ between the bottom surface (an inner surface) of the encapsulation substrate 200 coming into contact with the organic light emitting diode array (TFT, OLED) on the array substrate 100 and the first lateral surface of the encapsulation substrate 200 is 90°, a third lateral surface connecting the first lateral surface and the second lateral surface to each other is defined.

That is, if the organic light emitting diode display device of the present invention as described above is of a bottom emission type in which light emitted from the organic light emitting diode is discharged outward through the substrate, the drive chip to apply a drive signal to the organic light emitting diode array is mounted on the film and located on the rear surface of the encapsulation substrate. The film applies a drive signal to the pad formed on the substrate and is provided along the lateral surface of the encapsulation substrate.

In this case, at least one lateral surface of the encapsulation substrate 200 is inclined by at least one gradient, which may prevent disconnection and cracks of the film 300a due to a sharp edge of the encapsulation substrate 200. In this case, a narrow bezel of the organic light emitting diode display device may be accomplished.

Second Embodiment

Figure 6:
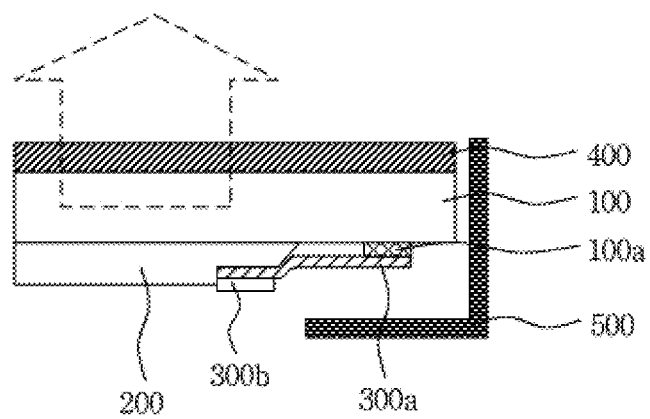
FIG. 6 is a sectional view of an organic light emitting diode display device according to a second embodiment of the present invention.
Figure 7:
FIG. 7 is an enlarged view of an encapsulation substrate of FIG. 6.

FIG. 6 is a sectional view of an organic light emitting diode display device according to a second embodiment of the present invention, and FIG. 7 is an enlarged view of an encapsulation substrate of FIG. 6.

The organic light emitting diode display device according to the second embodiment of the present invention, as exemplarily shown in FIGS. 6 and 7, includes the encapsulation substrate 200 having a recess 200a formed in a lateral surface thereof, and the lateral surface provided with the recess 200a is inclined. That is, one lateral surface of the encapsulation substrate 200 is not wholly inclined, and the recess 200a is formed between the inclined portion of the lateral surface of the encapsulation substrate 200 and the top surface (the rear surface) of the encapsulation substrate 200, such that the drive chip 300b to drive the organic light emitting diode array TFT, OLED of the array substrate 100 is seated in the recess 200a.

As such, in the organic light emitting diode display device according to the second embodiment of the present invention, the drive chip 300b is seated in the recess 200a and secured to the rear (top) surface of the encapsulation substrate 200. In addition, the recess 200a may efficiently prevent not only movement of the film 300a, but also cracks or disconnection of the film 300a.

Third Embodiment

Figure 8:
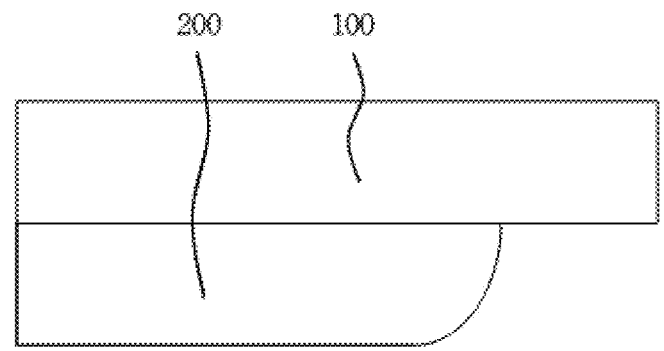
FIGS. 8 and 9 are sectional views of an organic light emitting diode display device according to a third embodiment of the present invention.
Figure 9:
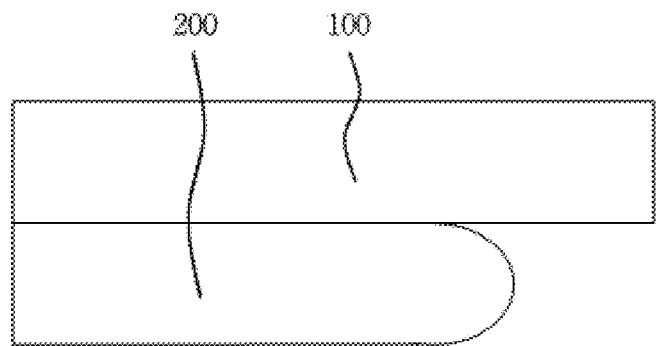

FIGS. 8 and 9 are sectional views of an organic light emitting diode display device according to a third embodiment of the present invention.

As exemplarily shown in FIGS. 8 and 9, the organic light emitting diode display device according to the third embodiment of the present invention is configured such that one lateral surface of the encapsulation substrate 200 has a curvature. More specifically, only the lateral surface of the encapsulation substrate 200 may have a curvature as exemplarily shown in FIG. 8, or an edge between the lateral surface and the top surface of the encapsulation substrate 200 and an edge between the lateral surface and the bottom surface (the inner surface) of the encapsulation substrate 200 as well as the lateral surface of the encapsulation substrate 200 may have a curvature as exemplarily shown in FIG. 9.

As is apparent from the above description, an organic light emitting diode display device of the present invention may achieve a narrow bezel as a film, which supports a drive chip mounted thereon and is connected to a pad of an organic light emitting diode array, directly extends to an encapsulation substrate. In particular, at least one lateral surface of an encapsulation substrate is inclined by at least one gradient, which may prevent disconnection and cracks of the film disposed along the lateral surface of the encapsulation substrate.

It will be apparent that, although the preferred embodiments have been shown and described above, the invention is not limited to the above-described specific embodiments, and various modifications and variations can be made by those skilled in the art without departing from the gist of the appended claims. Thus, it is intended that the modifications and variations should not be understood independently of the technical sprit or prospect of the invention.

What is claimed is:

1. An organic light emitting diode display device comprising:
   a substrate;
   an organic light emitting diode array including a thin film transistor arranged on the substrate and an organic light emitting diode connected to the thin film transistor;
   a pad disposed on the substrate and configured to receive a drive signal to drive the organic light emitting diode array;
   an encapsulation substrate to cover the organic light emitting diode array, wherein the encapsulation substrate is metal; and
   a film having a first surface and a second surface, connected to the pad on the first surface, and provided with a drive chip on the second surface,
   wherein at least one lateral surface of the encapsulation substrate is inclined; and
   wherein the film is extended along the inclined lateral surface of the encapsulation substrate and a rear surface of the encapsulation substrate.

2. The device according to claim 1, wherein light emitted from the organic light emitting diode is discharged outward through the substrate.

3. The device according to claim 1, wherein the rear surface of the encapsulation substrate faces the first surface of the film.

4. The device according to claim 1, wherein a recess is formed between the inclined lateral surface of the encapsulation substrate and the rear surface of the encapsulation substrate.

5. The device according to claim 4, wherein the drive chip is seated in the recess.

6. The device according to claim 1, wherein the encapsulation substrate has a thickness within a range of 50 μm to 200 μm.

7. The device according to claim 1, wherein a first angle between an inner surface of the encapsulation substrate coming into contact with the organic light emitting diode array and the lateral surface of the encapsulation substrate is greater than 0° and less than 90°, and
   wherein a second angle between the lateral surface of the encapsulation substrate and the rear surface of the encapsulation substrate is greater than 90° and less than 180°.

* * * * *